(12) United States Patent
McGrath

(10) Patent No.: US 9,431,812 B1
(45) Date of Patent: Aug. 30, 2016

(54) DYNAMIC CAPACITORS FOR TUNING OF CIRCUITS

(71) Applicant: Xilinx, Inc., San Jose, CA (US)

(72) Inventor: John E. McGrath, Cahir (IE)

(73) Assignee: XILINX, INC., San Jose, CA (US)

( * ) Notice: Subject to any disclaimer, the term of this patent is extended or adjusted under 35 U.S.C. 154(b) by 980 days.

(21) Appl. No.: 13/621,942

(22) Filed: Sep. 18, 2012

(51) Int. Cl.
*G05F 1/10* (2006.01)
*H01H 51/34* (2006.01)
*H02G 7/20* (2006.01)
*B41J 2/045* (2006.01)

(52) U.S. Cl.
CPC .............. *H02G 7/20* (2013.01); *B41J 2/04541* (2013.01)

(58) Field of Classification Search
USPC ........................................................... 307/98
See application file for complete search history.

(56) References Cited

U.S. PATENT DOCUMENTS

| | | | | |
|---|---|---|---|---|
| 4,970,479 A | * | 11/1990 | Landt | H01P 1/2053 333/101 |
| 7,164,950 B2 | * | 1/2007 | Kroll | A61N 1/3718 607/36 |
| 2010/0109473 A1 | * | 5/2010 | Peterson | H02N 11/002 310/306 |
| 2013/0082802 A1 | * | 4/2013 | Elad | H01P 3/003 333/246 |

* cited by examiner

*Primary Examiner* — Rexford Barnie
*Assistant Examiner* — Xuan Ly
(74) *Attorney, Agent, or Firm* — Kevin T. Cuenot

(57) ABSTRACT

A circuit includes a signal line formed of at least one conductive element and a shield at least partially encompassing the signal line. The circuit further includes a first dynamic capacitor located between the shield and the signal line. The first dynamic capacitor is configured to provide a first variable amount of capacitance.

19 Claims, 3 Drawing Sheets

DYNAMIC CAPACITORS FOR TUNING OF CIRCUITS

FIELD OF THE INVENTION

One or more embodiments disclosed within this specification relate to integrated circuits (ICs) and, more particularly, to tuning capacitance within a circuit of an IC.

BACKGROUND

Many high performance analog circuits receive and operate upon differential input signals. In order to function with a high level of accuracy, such a circuit has specific impedance matching requirements that must be met. These impedance matching requirements extend to the input signals including, for instance, differential input signals. As an example, a switched capacitor analog gain stage implemented within an integrated circuit (IC) can have a capacitive matching requirement of approximately 1 fF (femto-Farad) or less.

When the matching requirements are not met, accurate circuit operation is jeopardized and may be entirely unattainable. Unfortunately, the level of accuracy required in impedance matching is difficult to achieve given the variability inherent in any IC manufacturing process. An impedance mismatch in an analog circuit within an IC that renders the analog circuit inaccurate or inadequate for its intended purpose can render the entire IC unusable, thereby reducing IC yield.

SUMMARY

A circuit includes a signal line formed of at least one conductive element, a shield at least partially encompassing the signal line, and a first dynamic capacitor located between the shield and the signal line that is configured to provide a first variable amount of capacitance.

A circuit includes a signal line formed of at least one conductive element, a shield at least partially encompassing the signal line, and at least two dynamic capacitors located between the shield and the signal line. Each dynamic capacitor includes a conductive element located between the signal line and the shield and a switch configured to selectively couple the conductive element to a low impedance node to provide a variable amount of capacitance.

A method of implementing a circuit includes providing a signal line formed of at least one conductive element, providing a shield at least partially encompassing the signal line, and implementing a dynamic capacitor located between the shield and the signal line that is configured to provide a variable amount of capacitance. The amount of capacitance provided by the dynamic capacitor can be varied.

DETAILED DESCRIPTION OF THE DRAWINGS

Figure 1:
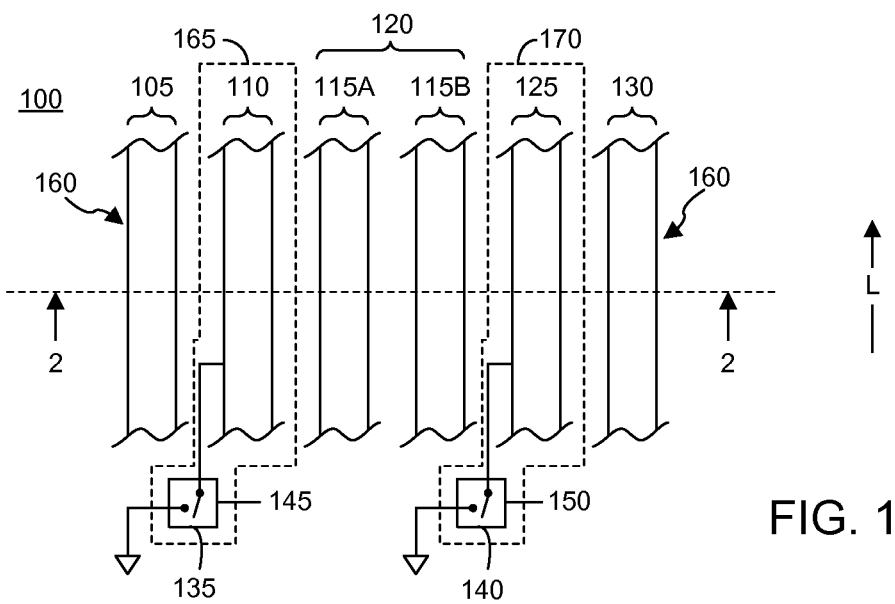
FIG. 1 is a first block diagram illustrating a circuit structure including dynamic capacitors.

While the specification concludes with claims defining novel features, it is believed that the various features disclosed within this specification will be better understood from a consideration of the description in conjunction with the drawings. The process(es), machine(s), manufacture(s), systems, and any variations thereof described within this specification are provided for purposes of illustration. Specific structural and functional details disclosed within this specification are not to be interpreted as limiting, but merely as a basis for the claims and as a representative basis for teaching one skilled in the art to variously employ the features described in virtually any appropriately detailed structure. Further, the terms and phrases used within this specification are not intended to be limiting, but rather to provide an understandable description of the features described.

This specification relates to integrated circuits (ICs) and, more particularly, to tuning the capacitance within a circuit of an IC. In accordance with the inventive arrangements disclosed within this specification, the capacitance within a circuit structure can be varied or tuned. The capacitance of conductive elements within a circuit can be varied dynamically, e.g., in operation, to adjust and/or accommodate for parasitic capacitances within the circuit structure.

Typically, a signal line carrying sensitive signals is shielded. The signal line is a differential pair, e.g., as may be provided as an input to a differential amplifier, or is single ended. A "shield" or "shielding" refers to a static, low impedance node or circuit element within a circuit that has a purpose of isolating one or more sensitive analog nodes of the circuit, e.g., the object(s) being shielded, from other signals in the circuit. The shielding is configured to at least partially, if not entirely, encompass the particular objects being shielded.

Though serving to reduce particular forms of electromagnetic noise, the existence of shielding does influence parasitic capacitance of a signal line. One or more conductive elements, referred to as dynamic capacitors, can be placed between the signal line and the shielding. One or more or all of the dynamic capacitors can be selectively coupled to a low impedance node using a switch. By connecting particular ones of the dynamic capacitors to a low impedance node, the amount of parasitic capacitance on the signal line can be adjusted, or tuned, to improve performance of the circuit coupled to the signal line.

Use of dynamic capacitors as described within this specification allows the capacitance of a signal line to be varied without physically connecting further circuit elements to the actual conductive element(s) that form the signal line and convey signal(s). Other conventional techniques for addressing impedance matching and parasitic capacitance attempt to insert capacitors within the signal path. The capacitors are physically connected to the signal line. Placing capacitors "inline" within the signal line introduces further undesired parasitic capacitances as a result of the transistors and/or other circuitry needed to insert the compensatory capacitors. Insertion of dynamic capacitors, as described within this specification, allows the capacitance of the signal line to be adjusted without physically altering the signal line itself or physically connecting circuit elements to the signal line.

For purposes of simplicity and clarity of illustration, elements shown in the figures have not necessarily been drawn to scale. For example, the dimensions of some of the elements may be exaggerated relative to other elements for clarity. Further, where considered appropriate, reference numbers are repeated among the figures to indicate corresponding, analogous, or like features.

FIG. 1 is a first block diagram illustrating a circuit structure including dynamic capacitors. Circuit structure 100 includes a plurality of conductive elements 105, 110, 115, 125, and 130. In one aspect, circuit structure 100 is implemented within an IC and, more particularly, within a semiconductor IC. The directional arrow marked as "L" indicates length in the figure.

A "conductive element" refers to a structure, such as a conductor, within an electronic circuit that is configured to propagate an electrical current and, as such, is characterized by a low resistivity. Examples of conductive elements include, but are not limited to, wires, traces, or the like. A conductive element typically is formed or implemented using any of a variety of metals as available within known IC and/or printed circuit board manufacturing processes to form wires or traces including patterned metal layers.

Within FIG. 1, conductive elements 115A and 115B, taken collectively, form a signal line 120. In the example shown in FIG. 1, signal line 120 is a differential signal, e.g., a differential pair. Each of conductive elements 115A and 115B is configured to convey a signal, whether a positive potential, a negative potential, a data signal, ground, etc. Conductive element 105 is part of a shield 160 for signal line 120. Conductive element 130, like conductive element 105, is part of shield 160 for signal line 120. Each of conductive elements 105 and 130 is coupled to a low impedance node (not shown). An example of a low impedance node includes, but is not limited to, ground.

Conductive element 110 and switch 135 implement a dynamic capacitor 165. Conductive element 125 and switch 140 implements a dynamic capacitor 170. As shown, conductive element 110 is coupled to switch 135. Conductive element 125 is coupled to switch 140. Each of switches 135 and 140 is characterized as having two operational states. The first operational state is when the switch is closed. The second operational state is when the switch is open. Switch 135 opens and closes responsive to the state of control signal 145. Switch 140 opens and closes responsive to the state of control signal 150.

A "switch" refers to any device that makes and breaks a connection in an electric circuit. Each of switches 135 and 140 can be implemented using any of a variety of known circuit components. In one aspect, one or more or both of switches 135 and 140 is implemented as a transistor that opens and closes responsive to a control signal, e.g., a control signal applied to the gate of the transistor. Other more complex switches can be utilized, e.g., multi-transistor switches, that are configured to open and close responsive to a control signal.

In the first operational state, switch 135 is closed. When switch 135 is closed, conductive element 110 is connected to a low impedance node. For example, when switch 135 is closed, conductive element 110 is connected to the same low impedance node as conductive element 105. In the first operational state, switch 140 is closed. When switch 140 is closed, conductive element 125 is connected to a low impedance node, e.g., the same low impedance node as conductive element 130 (and conductive element 105). In the second operational state, switch 135 is open. When switch 135 is open, conductive element 110 floats. In the second operational state, switch 140 is open. When switch 140 is open, conductive element 125 floats. A node or element of a circuit "floats" or is "floating" when the node is isolated. The node is isolated in that the node is not connected to ground at any point or through any path within a circuit. For example, when floating, the node is considered to be a high impedance node.

In the configuration illustrated in FIG. 1, conductive element 105, forming a shield element of shield 160, is located on a first side of signal line 120 corresponding to conductive element 115A. Conductive element 130, forming a second shield element of shield 160 is located on a second side of signal line 120 corresponding to conductive element 115B. Taken collectively, conductive elements 105 and 130, forming shield 160, at least partially encompass signal line 120. Shield 160 includes conductive elements on opposing sides of signal line 120.

Conductive element 110 is coupled to a low impedance node or left floating depending upon the state of control signal 145. The amount of capacitance seen by conductive element 115A varies according to whether conductive element 110 is connected to the low impedance node or is floating. The amount of capacitance seen by conductive element 115A is a first amount of capacitance when conductive element 110 is connected to the low impedance node. The amount of capacitance seen by conductive element 115A is a second amount that is less than the first amount when conductive element 110 is floating.

Similarly, conductive element 125 is coupled to a low impedance node or left floating, depending upon the state of control signal 150. The amount of capacitance seen by conductive element 115B varies according to whether conductive element 125 is connected to the low impedance node or is floating. The amount of capacitance seen by conductive element 115B is a first amount of capacitance when conductive element 125 is connected to the low impedance node. The amount of capacitance seen by conductive element 115B is a second amount that is less than the first amount when conductive element 125 is floating. Switches 135 and 140 can be opened and closed independently of one another.

In one aspect, each of switches 135 and 140 can be opened or closed during a tuning operation that is performed prior to release of the IC in which circuit structure 100 is implemented. In another aspect, each of switches 135 and 140 can be opened or closed during a tuning operation that is performed in the field. For example, each of switches 135 and 140 can be implemented as a programmable switch in that the state of the control signals can be programmed or determined when the IC including circuit structure 100 is released in the field and changed as may be required during operation of the IC.

While FIG. 1 is illustrated with two dynamic capacitors 165 and 170. It should be appreciated, however, that a single dynamic capacitor can be used. For example, only dynamic capacitor 165 or dynamic capacitor 170 can be included in circuit 100. In another aspect, additional dynamic capacitors can be used. Typically, when signal line 120 is a differential pair, the dynamic capacitors will be balanced or matched with respect to either side, or sides, of signal line 120.

Figure 2:
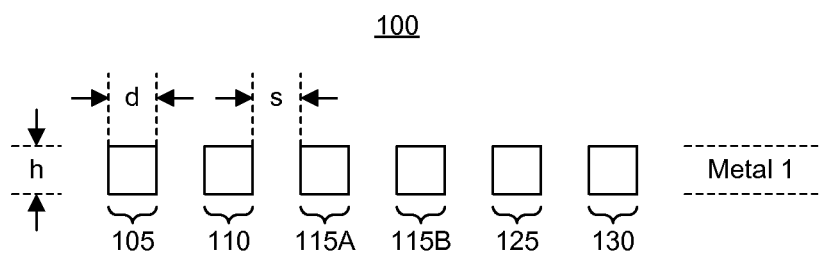
FIG. 2 is a second block diagram illustrating a cross-sectional side view of the circuit structure of FIG. 1.

FIG. 2 is a second block diagram illustrating a cross-sectional side view of circuit structure 100 of FIG. 1. FIG. 2 generally illustrates the spacing between elements of IC structure 100 and the relative sizes of the elements. As shown, conductive element 105 has a width denoted as "d." For purposes of discussion, each of elements 105, 110, 115, 125, and 130 has a width of d, though this need not be the case. Each of elements 105, 110, 115, 125, and 130 further has a height of "h." In the example presented in FIG. 2, each of conductive elements 105, 110, 115, 125, and 130 is implemented within a same processing layer, e.g., a same metal layer, denoted as "Metal 1." In addition, immediately adjacent conductive elements are separated by a distance of "s." For example, conductive element 105 is separated from conductive element 110 by the distance s. Similarly, conductive element 110 is separated from conductive element 115 by the distance of s.

Referring to FIGS. 1 and 2 in combination, the value of the capacitance seen by conductor 115A varies according to whether conductor 110 is coupled to ground or left floating. When conductor 110 is coupled to a low impedance node, the capacitance seen by conductor 115A is proportional to A/s (capacitance ∝ A/s), where "A" represents the cross-sectional area of conductive element 110. The cross-sectional area of conductive element 110 is "h×L," wherein L is the length of the conductors as illustrated in FIG. 1. When conductive element 110 is not coupled to a low impedance node and is floating, the capacitance seen by conductive element 115A is proportional to A/(2s) (capacitance ∝ A/(2s). Again, "A" represents the cross-sectional area of conductive element 110. The capacitance seen by conductive element 115A is smaller when capacitive element 110 is connected to the low impedance node than when capacitive element 110 is left floating.

Similarly, the value of the capacitance seen by conductor 115B varies according to whether conductor 125 is coupled to a low impedance node or left floating. When conductor 125 is coupled to a low impedance node, the capacitance seen by conductor 115B is proportional to A/s (capacitance ∝ A/s), where "A" represents the cross-sectional area of conductive element 125. The cross-sectional area of conductive element 125 is "h×L." When conductive element 125 is coupled to a low impedance node, the capacitance seen by conductive element 115B is proportional to A/(2s) (capacitance ∝ A/(2s). Again, "A" represents the cross-sectional area of conductive element 125. The capacitance seen by conductive element 115B is smaller when capacitive element 125 is connected to the low impedance node than when capacitive element 125 is left floating.

The mathematical expressions and relationships disclosed within this specification describing capacitance are intended to exemplify relationships between the various properties illustrated in the Figures and described herein. The expressions, however, have been simplified for purposes of clarity and ease of illustration. Effects such as fringing, for example, are not taken into account within the expressions. The exclusion of any such parameters for purposes of clarity is not intended to imply that such parameters cannot be incorporated into the teachings and expressions disclosed within this specification or be construed as limiting of the examples presented.

Figure 3:
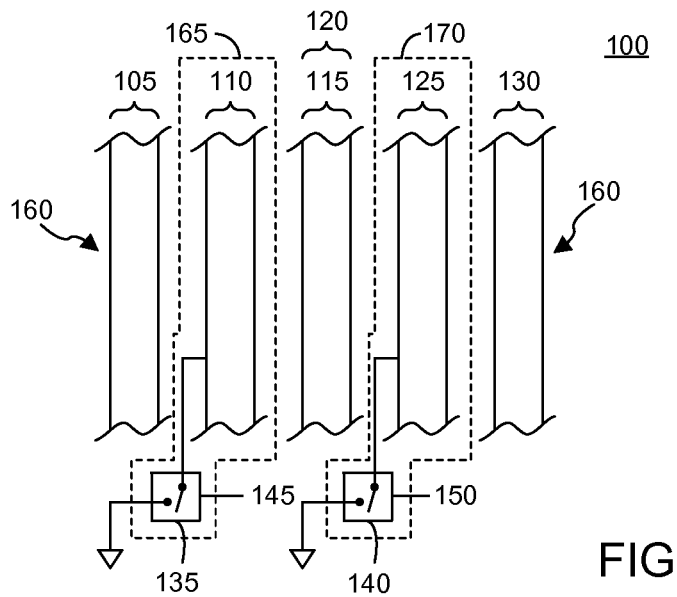
FIG. 3 is a third block diagram illustrating a circuit structure including dynamic capacitors.

FIG. 3 is a third block diagram illustrating a circuit structure including dynamic capacitors. More particularly, FIG. 3 illustrates circuit structure 100 of FIG. 1 in which signal line 120 is a single ended signal formed of a single conductive element 115. While FIG. 3 is illustrated with two dynamic capacitors 165 and 170, a single dynamic capacitor (e.g., either dynamic capacitor 165 or dynamic capacitor 170) can be used. In another aspect, additional dynamic capacitors can be used.

Figure 4:
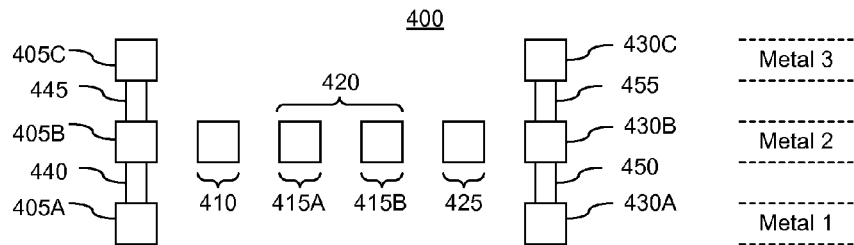
FIG. 4 is a fourth block diagram illustrating a cross-sectional side view of a circuit structure including dynamic capacitors.

FIG. 4 is a fourth block diagram illustrating a cross-sectional side view of a circuit structure 400 including dynamic capacitors. Circuit structure 400 is implemented in a manner that is similar to circuit structure 100 of FIGS. 1 and 2. Conductive elements 415A and 415B, taken collectively, form a differential pair type of signal line 420. Conductive element 410 and conductive element 425 each can be selectively connected to a low impedance node or left floating through a switch (not shown) as described with reference to FIG. 1.

In the example shown in FIG. 4, however, the shielding extends both above and below the differential pair. As pictured, the shielding includes three conductive elements 405 with conductive element 405A located in Metal 1, conductive element 405B located in Metal 2, and conductive element 405C located in Metal 3. Conductive element 405A can be connected to conductive element 405B using one or more vias 440. Conductive element 405B can be connected to conductive element 405C using one or more vias 445. Similarly, the shielding includes three conductive elements 430 with conductive element 430A located in Metal 1, conductive element 430B located in Metal 2, and conductive element 430C located in Metal 3. Conductive element 430A can be connected to conductive element 430B using one or more vias 450. Conductive element 430B can be connected to conductive element 430C using one or more vias 455.

It should be appreciated that while FIG. 4 illustrates the case where conductive elements 410 and 425 are implemented only within Metal 2. However, in another example, conductive elements 410 and 425 can be stacked and connected by vias, as shown with respect to conductive elements 405 and 430. Thus, the dynamic capacitors can be built in a stacked, or wall, type of arrangement to correspond with the particular formation and/or type of shielding that is used. Each of elements 410 and 425 can be extended to include conductive elements in each of Metal 1 and Metal 3 using vias.

In general, the capacitance seen by conductive element 415A is defined by the same relationships (expressions) described with reference to FIG. 2 and varies according to whether conductive element 410 is connected to a low impedance node or is floating. Similarly, the capacitance seen by conductive element 415B is defined by the same relationships (expressions) described with reference to FIG. 2 and varies according to whether conductive element 425 is connected to a low impedance node or is floating.

It should be appreciated that the particular way in which the shield is implemented can vary. In another example, the shield can extend only above the differential pair (e.g., include conductive elements 405B, 405C, 430B, and 430C), extend only below the differential pair (e.g., include conductive elements 405A, 405B, 430A, and 430C). In other examples, the right and left side of the shielding can be different, e.g., one side is implemented as shown as in FIG. 2 while the other side extends above, below, or both. It should be appreciated that the particular way in which the shield is implemented is not intended as a limitation of the features described within this specification.

Figure 5:
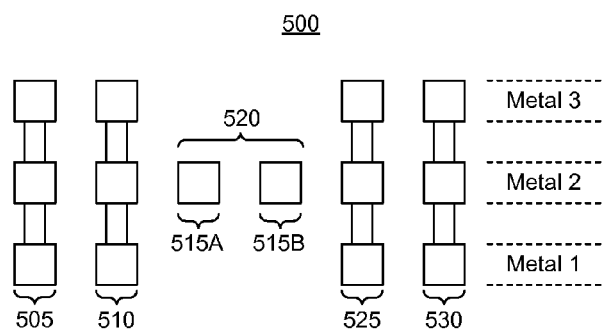
FIG. 5 is a fifth block diagram illustrating a cross-sectional side view of a circuit structure including dynamic capacitors.

FIG. 5 is a fifth block diagram illustrating a cross-sectional side view of a circuit structure 500 including dynamic capacitors. Circuit structure 500 illustrates the example noted with reference to FIG. 4 in which conductive elements 505 and 530, each being a shield element, are built using multiple metal layers and vias. As shown, dynamic capacitors 510 and 525 are also built using multiple metal layers and vias on each side of conductive elements 515A and 515B forming signal line 520. Again, the switches for the dynamic capacitors formed of conductive elements 510 and 520 are not shown.

Figure 6:
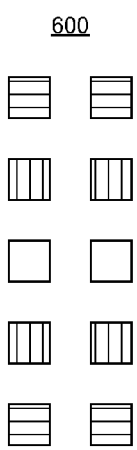
FIG. 6 is a sixth block diagram illustrating a cross-sectional side view of a circuit structure including dynamic capacitors.

FIG. 6 is a sixth block diagram illustrating a cross-sectional side view of a circuit structure 600 including dynamic capacitors. FIG. 6 illustrates an arrangement in which the shield is located above and below, e.g., on opposing sides of, the signal line. The signal line in FIG. 6 is a differential pair. For purposes of illustration, conductive elements with horizontal fill patterns represent shielding. Conductive elements with vertical fill patterns represent dynamic capacitors. Conductive elements with no fill pattern represent the signal line. The shading convention described with reference to FIG. 6 is also used within each of FIGS. 7 and 8.

It should be appreciated that while individual conductors are shown in each layer within FIG. 6, in another example, two or more conductive elements forming a dynamic capacitor and/or a shield element can be replaced by a single, wider conductive element such as a plate or a plane.

Figure 7:
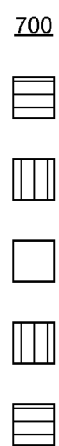
FIG. 7 is a seventh block diagram illustrating a cross-sectional side view of a circuit structure including dynamic capacitors.

FIG. 7 is a seventh block diagram illustrating a cross-sectional side view of a circuit structure 700 including dynamic capacitors. FIG. 7 illustrates an arrangement in which shielding is located above and below the signal line. The signal line in FIG. 7 is a single ended signal line formed of a single conductive element.

Figure 8:
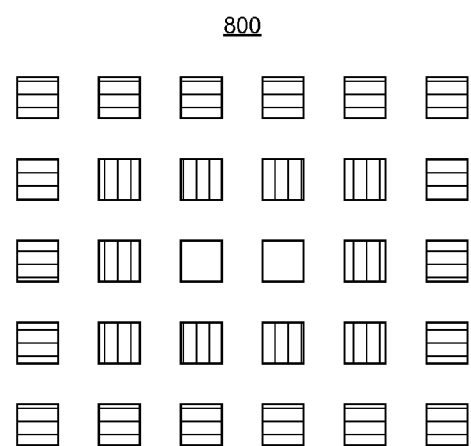
FIG. 8 is an eighth block diagram illustrating a cross-sectional side view of a circuit structure including dynamic capacitors.

FIG. 8 is an eighth block diagram illustrating a cross-sectional side view of a circuit structure 800 including dynamic capacitors. FIG. 8 illustrates an arrangement in which shielding is located above, below, and on each side of the signal line. The signal line in FIG. 8 is a differential pair, but could be implemented as a single ended signal. FIGS. 6-8 illustrate various exemplary shielding configurations that can be implemented within an IC and different locations in which dynamic capacitors can be included between the shield and the signal line. However, other configurations and locations can be used.

Figure 9:
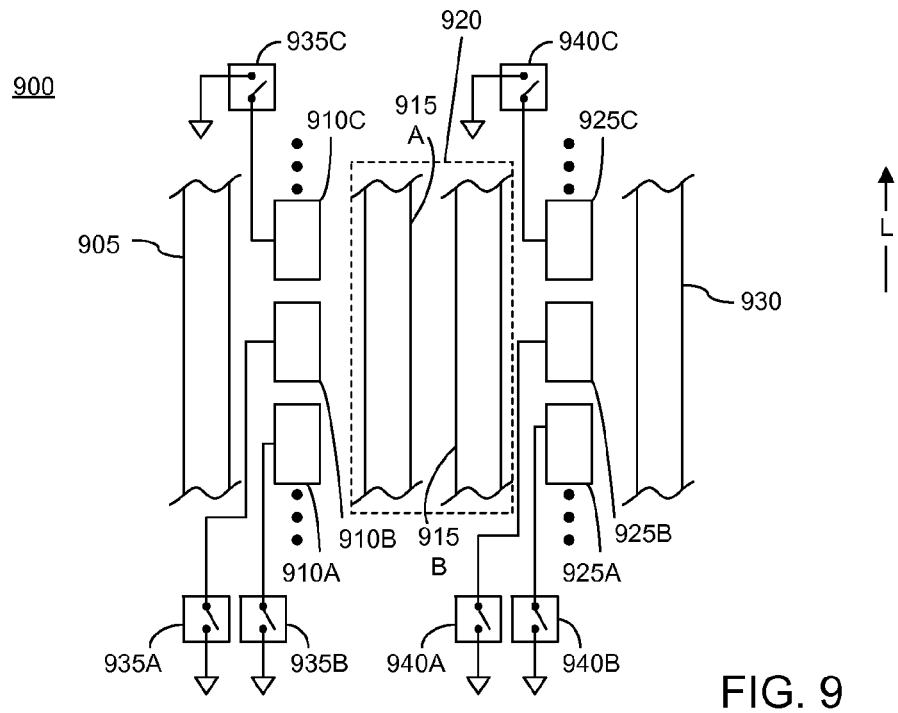
FIG. 9 is a ninth block diagram illustrating a circuit structure including dynamic capacitors.

FIG. 9 is a ninth block diagram illustrating a circuit structure including dynamic capacitors. Circuit structure 900 includes a plurality of conductive elements 905, 910, 915, 925, and 930. Each of conductive elements 915A and 915B is configured to convey a signal and, taken collectively, forms signal line 920 (e.g., a differential pair). Conductive element 905 is a shield element for signal line 920. Conductive element 930, like conductive element 905, is a shield element for signal line 920. Each of conductive elements 905 and 930 is coupled to a low impedance node (not shown).

Each of conductive elements 910 and 925, in combination with switches 935 and 940 respectively, implements a dynamic capacitor. More particularly, within FIG. 9, six different dynamic capacitors are formed by the following conductive element-switch pairs:

dynamic capacitor 1=conductive element 910A and switch 935A dynamic capacitor 2=conductive element 910B and switch 935B dynamic capacitor 3=conductive element 910C and switch 935C dynamic capacitor 4=conductive element 925A and switch 940A dynamic capacitor 5=conductive element 925B and switch 940B dynamic capacitor 6=conductive element 925C and switch 940C In one aspect, each of conductive elements 910A, 910B, 910C, 925A, 925B, and 925C can be viewed as a separate conductive element. In another aspect, each of conductive elements 910 and 925 can be viewed as being divided or broken out into a plurality of segments.

In any case, each of dynamic capacitors 1-6 can be operated as described with reference to FIG. 1 in that each of dynamic capacitors 1-6 is switchable to connect to either the low impedance node to which the shield is connected or be left floating. Further, each of dynamic capacitors 1-6 can be controlled independently via a control signal provided to the respective switch of the dynamic capacitor. Appreciably, one or more of dynamic capacitors 1-6 also can be controlled as a group by providing a same control signal to each dynamic capacitor in the same group. Further, one or more of dynamic capacitors 1-6 can be sized differently to weight the amount of capacitance that is provided to reduce the number of control signals needed while still providing fine-grain control over the capacitive value obtained.

The example of FIG. 9 illustrates that fine control over capacitance can be provided by segmenting the conductive element located between the shield and the differential pair into a plurality of segments. The segments, e.g., conductive elements 910A-910C and conductive elements 925A-925C can be configured to have the same lengths or varying lengths as may be desired.

In general, the more of switches 935A, 935B, and 935C that are open to allow conductive elements 910A, 910B, and 910C to float, the smaller the capacitance seen by conductive element 915A. The more of switches 935A, 935B, and 935C that are closed to connect conductive elements 910A, 910B, and 910C to ground, the larger the capacitance seen by conductive element 915A.

Similarly, the more of switches 940A, 940B, and 940C that are open to allow conductive elements 925A, 925B, and 925C to float, the smaller the capacitance seen by conductive element 915B. The more of switches 940A, 940B, and 940C that are closed to connect conductive elements 925A, 925B, and 925C to ground, the larger the capacitance seen by conductive element 915B.

It should be appreciated that the shielding as implemented by conductive elements 905 and 930 can be implemented in any of a variety of different ways as previously described. Further, one or more or all of conductive elements 910A, 910B, and/or 910C can be located in a different metal layer than the differential pair formed by conductive elements 915 and 920 or not. Further, one or more of conductive elements 910A, 910B, and 910C can be located in different metal layers as opposed to implementing each dynamic capacitor in the same metal layer.

Similarly, one or more or all of conductive elements 925A, 925B, and/or 925C can be located in a different metal layer than the differential pair formed by conductive elements 915 and 920 or not. Further, one or more of conductive elements 925A, 925B, and 925C can be located in different metal layers as opposed to implementing each dynamic capacitor in the same metal layer. While in many cases the configuration of conductive element 910 will match that of conductive element 925, e.g., in terms of the metal layers used, the lengths of individual conductive elements, and generally being symmetric with respect to the differential pair, this need not be the case as different configurations can be implemented to yield the same or very similar capacitive values.

While FIG. 9 is illustrated with a differential pair type of signal line, the features illustrated in FIG. 9 relating to the use of multiple dynamic capacitors, multiple segments, and/or varied conductive lengths can be applied in the case of a single ended type of signal line. Further, the concepts described with reference to FIG. 9 can be applied in cases where the dynamic capacitors are implemented to occupy multiple metal layers as illustrated in FIG. 5.

Figure 10:
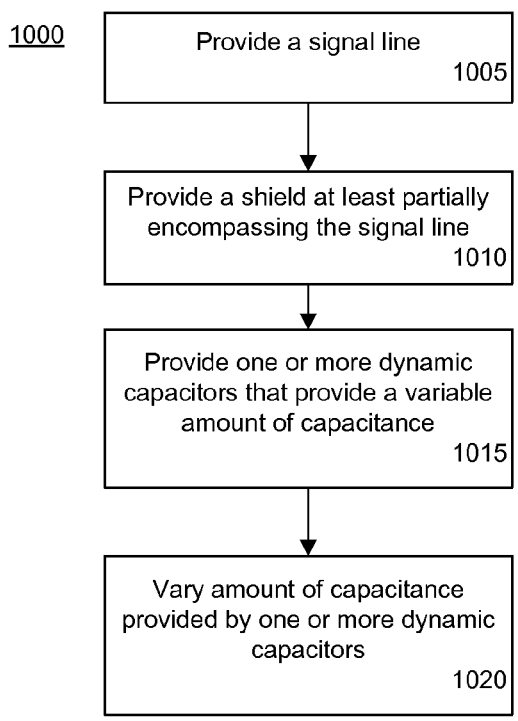
FIG. 10 is a flow chart illustrating an exemplary method of implementing a circuit structure including dynamic capacitors.

FIG. 10 is a flow chart illustrating an exemplary method 1000 of implementing a circuit structure including dynamic capacitors. Method 1000 can begin in block 1005, where a signal line formed of one or more conductive elements is provided. For example, the signal line can be single ended or a differential pair. In block 1010, a shield that at least partially encompasses the signal line is provided. In block 1015, one or more dynamic capacitors that provide a variable amount of capacitance are implemented. In block 1020, the amount of capacitance provided by at least one of the dynamic capacitors is varied.

For example, as discussed, each dynamic capacitor can include a conductive element located between the signal line and the shield and a switch configured to selectively couple the conductive element to a low impedance node to provide a variable amount of capacitance. The capacitance can be varied, at least in part, by connecting the conductive element to the low impedance node or disconnecting the conductive element from the low impedance node to float the conductive element responsive to a control signal provided to the switch. Appreciably, each dynamic capacitor can be controlled independently.

The features described in this specification provide dynamic capacitors that allow the capacitance in a circuit to be tuned. Each dynamic capacitor provides a variable amount of capacitance based upon whether the dynamic capacitor is connected to ground or left floating. By providing variable capacitors in the form of dynamic capacitors that do not connect directly to the signal line, fine grained adjustments to capacitance can be effectuated without introducing parasitic capacitance effects commonly found with other tuning techniques.

For purposes of explanation, specific nomenclature is set forth to provide a thorough understanding of the various inventive concepts disclosed herein. The terminology used herein, however, is for the purpose of illustrating the features described and is not intended to be limiting.

For example, the terms "a" and "an," as used herein, are defined as one or more than one. The term "plurality," as used herein, is defined as two or more than two. The term "another," as used herein, is defined as at least a second or more. The term "coupled," as used herein, is defined as connected, whether directly without any intervening elements or indirectly with one or more intervening elements, unless otherwise indicated. Two elements also can be coupled mechanically, electrically, or communicatively linked through a communication channel, pathway, network, or system. The term "connected" means that the elements that are connected are physically coupled to one another.

The term "and/or" as used herein refers to and encompasses any and all possible combinations of one or more of the associated listed items. It will be further understood that the terms "includes" and/or "including," when used in this specification, specify the presence of stated features, integers, steps, operations, elements, and/or components, but do not preclude the presence or addition of one or more other features, integers, steps, operations, elements, components, and/or groups thereof. It will also be understood that, although the terms first, second, etc. may be used herein to describe various elements, these elements should not be limited by these terms, as these terms are only used to distinguish one element from another.

The term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context.

Within this specification, the same reference characters are used to refer to terminals, signal lines, wires, and their corresponding signals. In this regard, the terms "signal" and "wire" may be used interchangeably, from time-to-time, within this specification.

The flowchart and block diagrams in the Figures illustrate the architecture, functionality, and operation of possible implementations of process(es), machine(s), manufacture(s), and/or systems utilizing one or more of the features described herein. In some alternative implementations, the functions noted in the blocks may occur out of the order noted in the figures. For example, two blocks shown in succession may be executed substantially concurrently, or the blocks may sometimes be executed in the reverse order, depending upon the functionality involved.

The corresponding structures, materials, acts, and equivalents of all means or step plus function elements in the claims below are intended to include any structure, material, or act for performing the function in combination with other claimed elements as specifically claimed.

The features disclosed within this specification can be embodied in other forms without departing from the spirit or essential attributes thereof. Accordingly, reference should be made to the following claims, rather than to the foregoing specification, as indicating the scope of such features and implementations.

What is claimed is:

1. A circuit having a structure, comprising:
    a signal line formed of at least one conductive element;
    a shield at least partially encompassing the signal line, wherein the shield is positioned parallel to the signal line; and
    a first dynamic capacitor configured to provide a first variable amount of capacitance, wherein the first dynamic capacitor comprises:
        a first conductive element located between the signal line and the shield;
        wherein the first conductive element is positioned parallel to the signal line; and
        a first switch configured to couple the first conductive element to a low impedance node in a first state or decouple the first conductive element from the low impedance node and float the first conductive element in a second state responsive to a control signal, wherein the first state and the second state of the first dynamic capacitor provide different amounts of capacitance for the first variable amount of capacitance.

2. The circuit of claim 1, wherein the signal line is a single ended signal formed of a single conductor.

3. The circuit of claim 1, wherein the signal line is a differential signal formed of two conductors.

4. The circuit of claim 1, wherein the first dynamic capacitor is not physically connected to the signal line.

5. The circuit of claim 1, wherein the first dynamic capacitor is field programmable.

6. The circuit of claim 1, further comprising:
a plurality of dynamic capacitors inclusive of the first dynamic capacitor, each comprising a conductive element between the signal line and the shield and a switch configured to selectively couple the conductive element to a low impedance node;
wherein the conductive elements are parallel to the signal line; and
wherein the conductive elements and the first conductive element substantially surround the signal line.

7. The circuit of claim 1, wherein the first conductive element, the shield, and the signal line are implemented in a same metal layer.

8. The circuit of claim 1, further comprising:
a second dynamic capacitor located between the shield and the signal line configured to provide a second variable amount of capacitance.

9. The circuit of claim 8, wherein the second dynamic capacitor comprises:
a second conductive element located between the signal line and the shield; and
a second switch configured to selectively couple the second conductive element to a low impedance node.

10. The circuit of claim 9, wherein:
the second switch is configured to couple the second conductive element to the low impedance node in a first state or decouple the second conductive element from the low impedance node and float the second conductive element in a second state responsive to a control signal; and
the first state and the second state provide different amounts of capacitance.

11. The circuit of claim 1, wherein:
the conductive element of the dynamic capacitor comprises a plurality of vertically aligned conductive elements, each parallel to the signal line; and
the plurality of vertically aligned conductive elements are coupled using vias.

12. A circuit, comprising:
a signal line formed of at least one conductive element;
a shield at least partially encompassing the signal line, wherein the shield is positioned parallel to the signal line; and
at least two dynamic capacitors located between the shield and the signal line, wherein each dynamic capacitor comprises:
a conductive element located between the signal line and the shield and is parallel to the signal line; and
a switch configured to couple the conductive element to a low impedance node in a first state or decouple the conductive element from the low impedance node and float the conductive element in a second state responsive to a control signal, wherein for each dynamic capacitor, the first state and the second state provide different amounts of capacitance for a variable amount of capacitance;
wherein each of the at least two dynamic capacitors is not physically connected to the signal line and the conductive elements of the at least two dynamic capacitors are aligned.

13. The circuit of claim 12, wherein the conductive element of a first dynamic capacitor is of a same length as the conductive element of a second dynamic capacitor.

14. The circuit of claim 12, wherein the conductive element of a first dynamic capacitor is of a different length than the conductive element of a second dynamic capacitor.

15. The circuit of claim 12, wherein the switch of each dynamic capacitor is operative independently of the other.

16. The circuit of claim 12, wherein the conductive elements, the shield, and the signal line are implemented in a same metal layer.

17. A method of implementing a circuit, comprising:
providing a signal line formed of at least one conductive element;
providing a shield at least partially encompassing the signal line, wherein the shield is positioned parallel to the signal line;
implementing a dynamic capacitor located between the shield and the signal line that is configured to provide a variable amount of capacitance, wherein the first dynamic capacitor comprises:
a conductive element located between the signal line and the shield;
wherein the conductive element is positioned parallel to the signal line; and
a switch configured to selectively couple the conductive element to a low impedance node to provide a variable amount of capacitance;
wherein the dynamic capacitor is not physically connected to the signal line; and
varying the variable amount of capacitance provided by the dynamic capacitor by coupling the first conductive element to the low impedance node in a first state or decoupling the first conductive element from the low impedance node and floating the first conductive element in a second state responsive to a control signal, wherein the first state and the second state of the first dynamic capacitor provide different amounts of capacitance.

18. The method of claim 17, wherein the first conductive element, the shield, and the signal line are implemented in a same metal layer.

19. The method of claim 17, wherein implementing a dynamic capacitor comprises:
implementing a plurality of dynamic capacitors, wherein each dynamic capacitor is controlled independently.

* * * * *